United States Patent [19]
Sumida et al.

[11] Patent Number: 5,629,495
[45] Date of Patent: May 13, 1997

[54] WATERPROOF BOX-LIKE CASING

[75] Inventors: Tatsuya Sumida; Yasuo Matsushita, both of Yokkaichi; Yuichi Akiyama, Aki-gun, all of Japan

[73] Assignee: Sumitomo Wiring Systems, Ltd., Mie, Japan

[21] Appl. No.: 197,342

[22] Filed: Feb. 16, 1994

[30] Foreign Application Priority Data

Feb. 22, 1993 [JP] Japan ................. 5-011979 U

[51] Int. Cl.⁶ ........................................... H05K 5/06
[52] U.S. Cl. ........................... 174/12 R; 174/17 VA
[58] Field of Search ....................... 174/12 R, 50, 174/50.5, 50.51, 50.52, 17 VA, 52.1, 59; 439/76, 521, 936; 200/302.1, 306, 83 W

[56] References Cited

U.S. PATENT DOCUMENTS 3,123,784  3/1964  Ritz ........................ 174/12 R X
3,670,276  6/1972  Theodore ................. 174/12 R X

FOREIGN PATENT DOCUMENTS

| 27 18 563 | 11/1978 | Germany . |
| 41 29 238 A1 | 3/1993 | Germany . |
| 56-112978 | 1/1980 | Japan . |
| 57-186094 | 5/1981 | Japan . |
| 1305905 | 2/1973 | United Kingdom ........ 174/12 R |
| WO84/01082 | 3/1984 | WIPO . |

*Primary Examiner*—Hyung S. Sough
*Attorney, Agent, or Firm*—Oliff & Berridge

[57] ABSTRACT

A waterproof box-like casing including, a box-like body having an opening, a lid for closing the opening and having a communication hole, and a bulkhead member for covering the communication hole hermetically. The communication hole provides communication between the inside and outside of the box-like body. Furthermore, the bulkhead member expands volume when the air inside of the waterproof box-like casing expands because of thermal expansion and contracts volume when the air inside of the waterproof box-like casing contracts because of thermal contraction.

4 Claims, 3 Drawing Sheets

1

WATERPROOF BOX-LIKE CASING

BACKGROUND OF THE INVENTION

This invention relates to a waterproof box-like casing, and more particularly to a waterproof box-like casing suited for housing an electronic unit or the like within an engine room of a vehicle.

An object to be waterproofed is received within a box-like body of a waterproof box-like casing having an opening, and then this opening is hermetically closed by a lid, and then the casing is mounted at a predetermined position. With a simple box-like sealed construction, however, the hermetic condition can not always be maintained in an environment in which the temperature abruptly changes. For example, a waterproof box-like casing holds an engine-control electronic equipment therein, and is mounted within an engine room. The interior of the engine room is liable to increase in temperature. When water is splashed on the waterproof casing during the running, the temperature drops abruptly. As a result, the atmospheric pressure within the casing decreases in accordance with the temperature change, and therefore a strain develops in the casing, so that the water intrudes through a gap around the lid of the hermetic construction.

Therefore, conventionally, as disclosed in Japanese Utility Model Unexamined Publication Nos. 56-112978 and 57-186094, a waterproof box-like casing has not been of a sealed construction, and instead a vent hole has been formed in the casing so as to make the inside and outside of the casing equal in atmospheric pressure to each other. In the construction shown in the former publication, the vent hole is in the form of a labyrinth, and moisture is held in the labyrinth when the outside air flows into the casing. In the construction shown in the latter publication, the vent hole is covered by an auxiliary plate to provide a staggered vent passage so that the water will not immediately intrude.

The above-mentioned conventional waterproof box-like casings have the following problems.

Namely, in the former, when an amount of the water which is greater than the water being able to be held in the labyrinth-like vent hole is drawn together with the outside air, this water intrudes into the interior. In the latter, the vigorously splashed water will inevitably intrude into the casing.

The present invention has been made in view of the above problems, and an object of the invention is to provide a waterproof box-like casing which can provide a good waterproof effect even in an environment in which a temperature change is vigorous.

SUMMARY OF THE INVENTION

To achieve the above object, the present invention provides a waterproof box-like casing comprising, a box-like body having an opening, a lid for closing the opening and having a communication hole, and a bulkhead member for covering the communication hole hermetically. The communication hole provides communication between the inside of the box-like body and the inside of the bulkhead member. Furthermore, the bulkhead member expands volume when the air inside of the waterproof box-like casing expands because of thermal expansion and contracts volume when the air inside of the waterproof box-like casing contracts because of thermal contraction. In the construction according to the present invention, the communication hole is closed by the deformable bulkhead member, and when the inside air volume varies in accordance with a temperature change, the bulkhead member is deformed to eliminate the atmospheric pressure change.

As described above, in the present invention, by intentionally deforming the bulkhead member, a change in the atmospheric pressure is eliminated so that a strain will not develop in those portions which should not originally be deformed. By doing so, there can be provided the waterproof box-like casing which can prevent the intrusion of water through a gap due to a strain, thereby enhancing the waterproof effect.

DETAILED DESCRIPTION OF THE PREFERRED EMBODIMENT

A preferred embodiment of the present invention will now be described with reference to the drawings.

Figure 1:
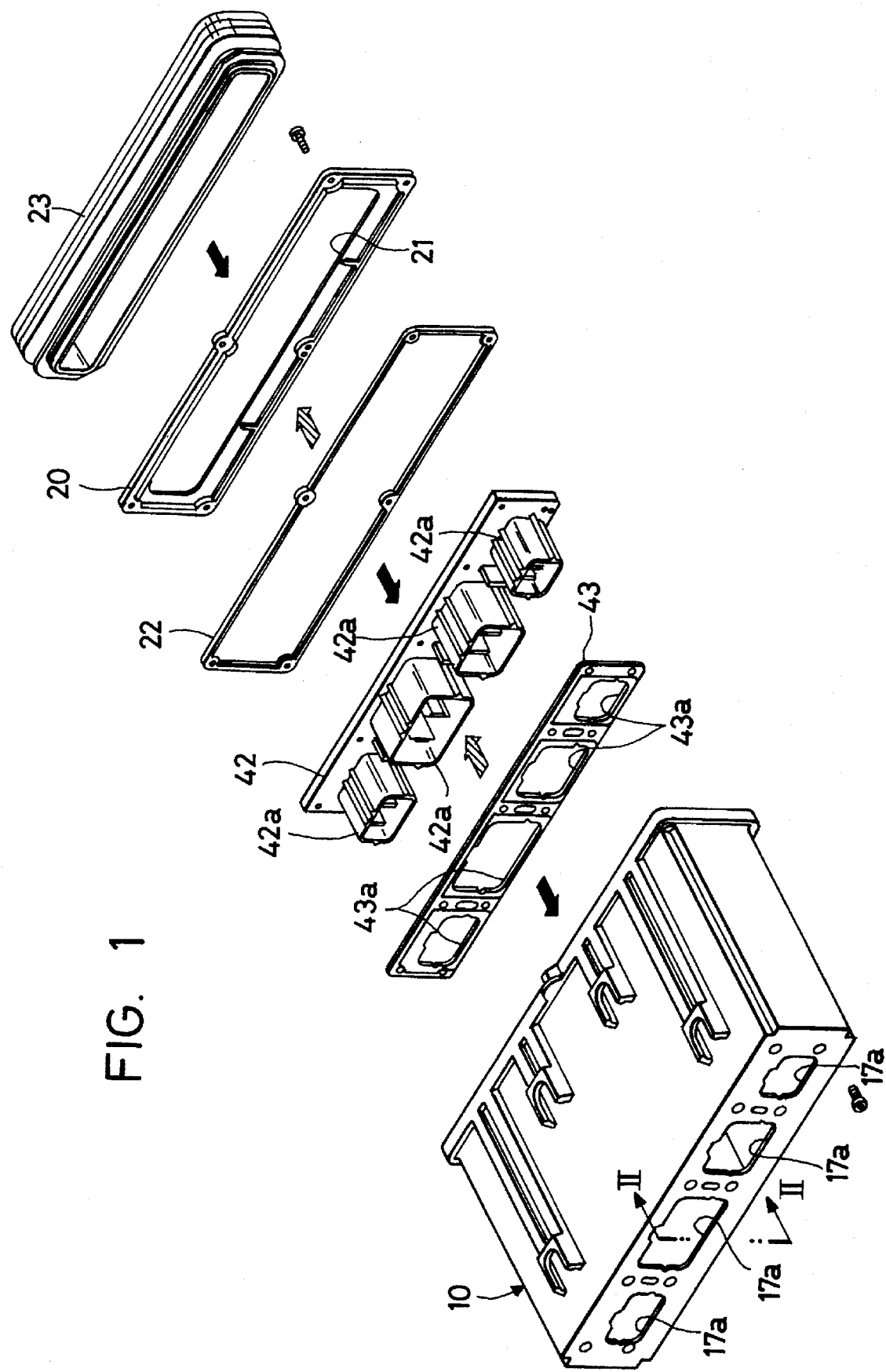
FIG. 1 is a perspective view of a preferred embodiment of a waterproof box-like casing of the present invention.
Figure 2:
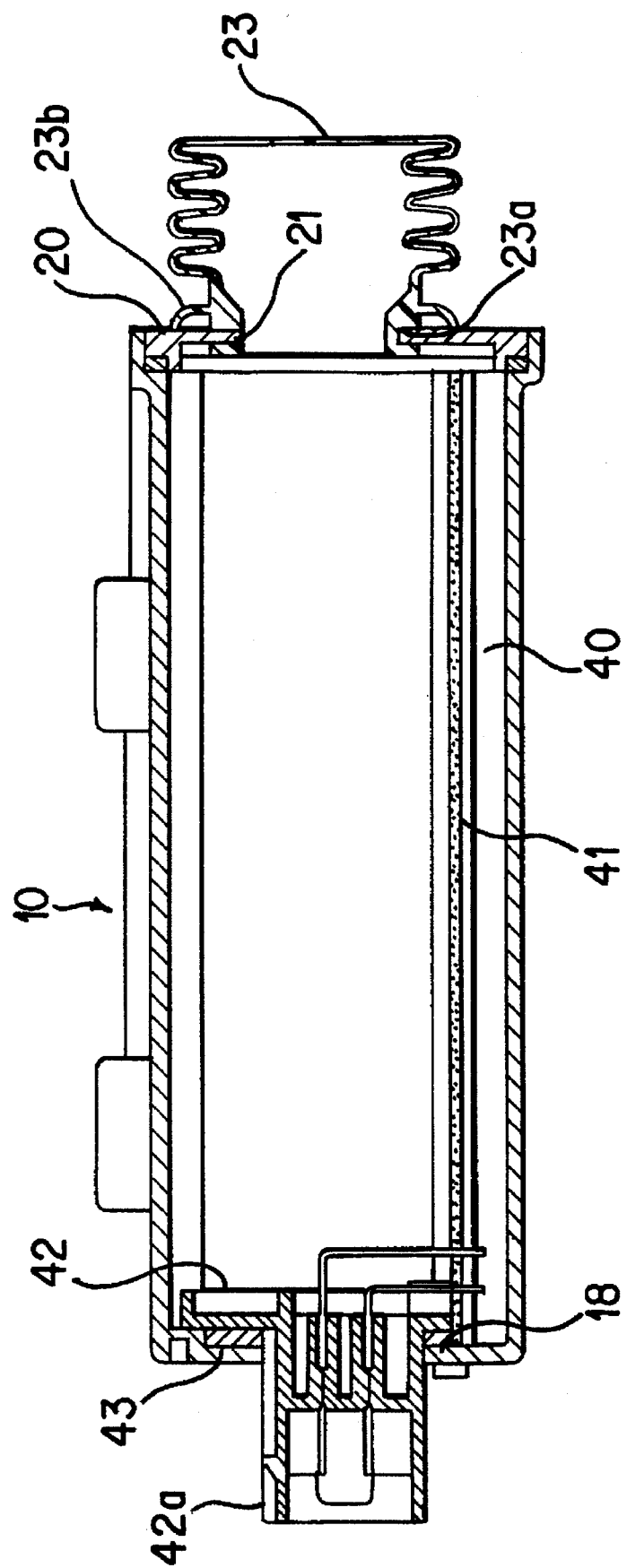
FIG. 2 is a cross-sectional view of the waterproof casing taken along the line II—II of FIG. 1, as assembled.

FIG. 1 is a perspective view of one preferred embodiment of a waterproof box-like casing of the present invention, and FIG. 2 is a cross-sectional view taken along the line II—II of FIG. 1, as assembled.

In these Figures, the waterproof box-like casing comprises a body 10 in the form of a box, and a lid 20 for closing an opening formed in a rear side of the body 10. A rubber packing 22 for sealing purposes is interposed between a peripheral edge of the opening of the body 10 and a peripheral edge of the lid 20.

An electronic board 40 having electronic elements mounted thereon is housed in the body 10. The electronic board 40 comprises a printed board 41 having the electronic elements mounted thereon, and a connector member 42 connected to a front edge of the printed board 41 in perpendicular relation thereto, the connector member 42 having four connectors 42a formed integrally thereon.

Connector passage holes 17a corresponding respectively to these connectors 42a are formed through a front side of the body 10, and the connectors 42a are projected respectively through the connector passage holes 17a to the outside of the body 10. A rubber packing 43, having cut-out holes 43a corresponding respectively to the connector passage holes 17a, is provided between the connector member 42 and an inner front wall 18 of the body 10.

The lid 20 is in the form of a frame, and has a window (communication hole) 21 formed therein. An expansible bag (bulkhead member) 23 made of rubber is provided at the window 21. The expansible bag 23 has a box-like shape having an opening at one side thereof, and a peripheral wall of the bag 23 is in the form of a bellows. A groove 23a is formed in outer surface of the open end of the bag 23 throughout the periphery thereof, and fits on the edge portion of the window 21 to hermetically connect the bag 23 to the window portion 21. The bag 23 also has a skirt portion 23b which is formed between the groove 23a and the bellows portion, and extends from the outer periphery in such a manner that a distal end portion of the skirt portion 23b is bent toward the groove 23a.

A method of using this embodiment of the above construction will now be described.

For assembling this construction, the expansible bag 23 is fitted in the window 21 formed in the lid 20. At this time, an adhesive is applied in the groove 23a in the expansible bag 23, and the edge portion of the window 21 is fitted in the groove 23a, thereby effecting the connection. When the expansible bag 23 is thus fitted in the window 21, the distal end of the skirt portion 23b is held against the peripheral edge portion of the window 21. Therefore, even when water is splashed, the water will not immediately flow into the groove 23a, and therefore the waterproof effect can be enhanced.

On the other hand, the connector member 42 is connected to the printed board 41 to complete the electronic board 40, and then the rubber packing 43 is attached thereto from the front side, and the electronic board 40 is inserted into the opening in the body 10 in such a manner that that side having the connector member 42 is first introduced thereinto. When the electronic board 40 is completely inserted into the body 10, the board is fastened to the body 10 by screws applied from the front side of the body 10.

Further, the lid 20 assembled as described above is fastened to the rear side of the body 10, with the rubber packing 22 interposed between the lid 20 and the body 10. In this condition, the waterproof box-like casing is received within an engine room, and waterproof connectors (not shown) are connected to the connectors 42a of the connector member 42, thus finishing the mounting operation.

Figure 3:
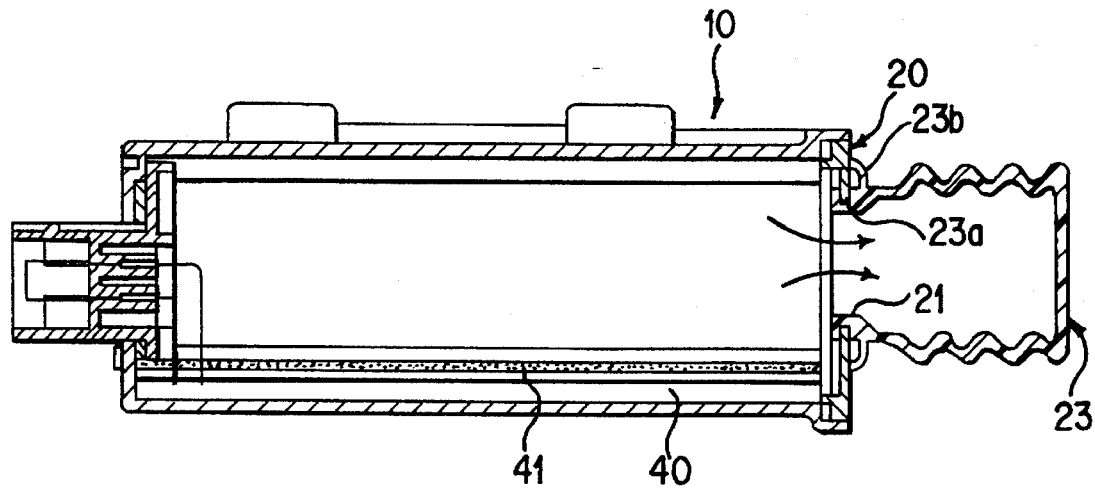
FIG. 3 is a cross-sectional view showing a deformed condition of an expansible bag at the time of thermal expansion.
Figure 4:
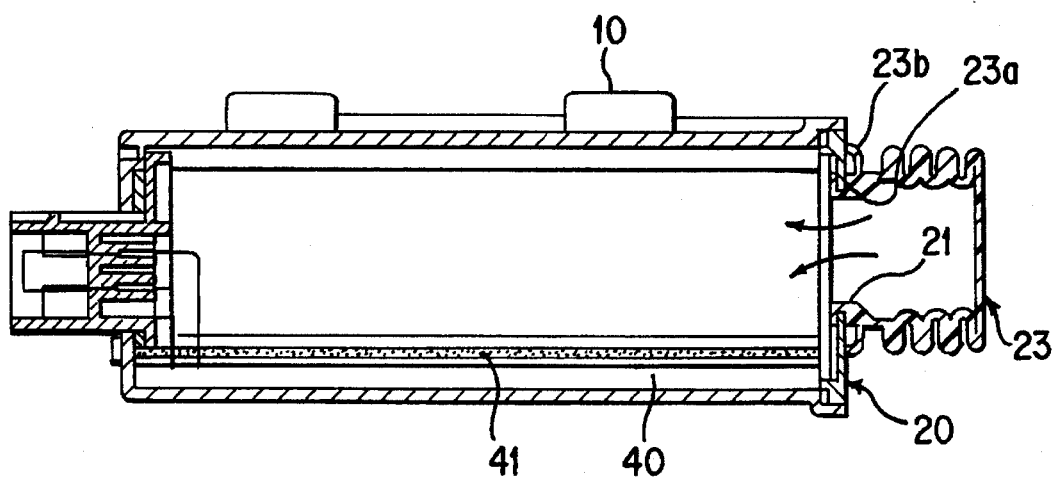
FIG. 4 is a cross-sectional view showing a deformed condition of the expansible bag at the time of thermal contraction.

The interior of the engine room becomes hot because of the heat of the engine, and therefore the heat transfers to the waterproof casing, so that the temperature of this casing becomes high. As a result, the air within the casing is thermally expanded to expand the expansible bag 23 as shown in FIG. 3. As a result of the expansion of the expansible bag 23, the inside pressure does not increase, and therefore the body 10 will not be deformed, and a gap will not develop in the portion of connection between the body 10 and the lid 20.

At this time, if water is splashed, the body 10 is abruptly cooled from its outside, so that the inside air tends to contract. Therefore, the expansible bag 23 is contracted to suppress an abrupt decrease of the inside pressure. Therefore, the body 10 will not be deformed, and a gap will not develop in the portion of connection between the body 10 and the lid 20.

In the above embodiment, although the bulkhead member is constituted by the expansible bag 23 in the form of a rubber bellows, it may be of such other shape than the bellows construction that it can easily allow a volume change, or may be in the form of a diaphragm of a highly-expansible material.

What is claimed is:

1. A waterproof box-like casing comprising:

a box-like body having an opening;

a lid for closing said opening and having a communication hole;

a bulkhead member for covering said communication hole, the bulkhead member including a groove and a skirt portion, said groove containing adhesive and being formed in an outer surface of said bulkhead member for mating with an edge portion of said communication hole to hermetically connect said bulkhead member to said communication hole, said skirt portion being extended from an outer periphery of said bulkhead member for preventing water from flowing into said groove;

said communication hole providing communication between the inside of said box-like body and the inside of said bulkhead member; and wherein said bulkhead member expands volume when air inside of the waterproof box-like casing expands because of thermal expansion and contracts volume when the air inside of the waterproof box-like casing contracts because of thermal contraction.

2. A waterproof box-like casing as claimed in claim 1, wherein said bulkhead member is made of rubber.

3. A waterproof box-like casing as claimed in claim 2, wherein a peripheral wall of said bulkhead member is in the form of bellows.

4. A waterproof box-like casing as claimed in claim 1, wherein said bulkhead member is made of a highly-expansible material.

* * * * *